United States Patent
Blood

(10) Patent No.: US 7,100,814 B2
(45) Date of Patent: Sep. 5, 2006

(54) METHOD FOR PREPARING INTEGRATED CIRCUIT MODULES FOR ATTACHMENT TO PRINTED CIRCUIT SUBSTRATES

(75) Inventor: James E. Blood, Shoreview, MN (US)

(73) Assignee: Cardiac Pacemakers, Inc., St. Paul, MN (US)

( * ) Notice: Subject to any disclaimer, the term of this patent is extended or adjusted under 35 U.S.C. 154(b) by 45 days.

(21) Appl. No.: 10/782,505

(22) Filed: Feb. 18, 2004

(65) Prior Publication Data

US 2005/0178815 A1    Aug. 18, 2005

(51) Int. Cl.
*B23K 31/12* (2006.01)
*B23K 31/00* (2006.01)

(52) U.S. Cl. .......... 228/103; 228/102; 228/180.5; 324/755; 324/756; 257/737; 257/778

(58) Field of Classification Search ........ 228/102–104; 257/778; 324/755, 765; 29/830, 840, 841, 29/846
See application file for complete search history.

(56) References Cited

U.S. PATENT DOCUMENTS

| | | | | |
|---|---|---|---|---|
| 4,801,561 A * | 1/1989 | Sankhagowit | ................. | 29/827 |
| 5,156,983 A * | 10/1992 | Schlesinger et al. | .......... | 29/827 |
| 5,260,168 A * | 11/1993 | Vernon | ........................ | 430/313 |
| 5,343,366 A * | 8/1994 | Cipolla et al. | ............... | 361/785 |
| 5,677,203 A * | 10/1997 | Rates | .......................... | 438/15 |
| 5,969,426 A * | 10/1999 | Baba et al. | .................. | 257/778 |
| 6,049,977 A * | 4/2000 | Atkins et al. | ................. | 29/843 |
| 6,166,556 A * | 12/2000 | Wang et al. | ................. | 324/765 |
| 6,188,232 B1 * | 2/2001 | Akram et al. | ................ | 324/755 |
| 6,249,052 B1 * | 6/2001 | Lin | ............................ | 257/737 |
| 6,407,566 B1 * | 6/2002 | Brunelle et al. | ............ | 324/758 |
| 6,642,730 B1 * | 11/2003 | Hembree et al. | ........... | 324/755 |
| 6,763,578 B1 * | 7/2004 | Farnworth et al. | ............ | 29/833 |
| 2004/0161865 A1 * | 8/2004 | Yu et al. | ....................... | 438/14 |
| 2005/0127531 A1 * | 6/2005 | Tay et al. | .................... | 257/786 |

OTHER PUBLICATIONS

BGA (Ball Grid Array); National Semiconductor Application Note 1126, Nov. 2002, AN-1126, pp. 1-10.

Design Guid of the TAB tape Carrier for the BGA Packaging, TD 98-0917, Sep. 17, 1998, Hitachi Cable Ltd. (4 pp).

Yanhong Tian and Chunqing Wang, Experimental Study on Laser and Hot Air Reflow Soldering of PBGA Solder Ball, IWC—Korea 2002, pp. 469-474.

Tape-Automated Bonding, Mar. 1997, Said F. Al-sarawi, Centre for High Performance Integrated Technologies and Systems (2 pp).

(Continued)

*Primary Examiner*—Lynne R. Edmondson
(74) *Attorney, Agent, or Firm*—Nikolai & Mersereau, P.A.; Thomas J. Nikolai

(57) ABSTRACT

A method of preparing an integrated circuit module for attachment to a PC substrate. At least one uncased semiconductor die is affixed to a TAB tape frame having concentrically arranged an outer conductive test pad footprint, and an intermediate bond pad footprint. Conductive traces connect the bond pads individually to test pads and to ball grid array pads on the TAB tape within the confines of the bond pad footprint. Wire bonds connect input/output points of the die to the bond pads The die and the wire bonding are next overmolded with a plastic forming a cased integrated circuit module. Testing and burn-in of the module is achieved by connecting test probes to the test pads After the test and burn-in step, the integrated circuit module is cut free from the TAB tape frame for attachment to a PC board, via the ball grid array.

4 Claims, 7 Drawing Sheets

OTHER PUBLICATIONS

Wire Bonding Interconnection, Mar. 1997, Said F. Al-sarawi, Centre for High Performance Integrated Technologies and Systems (2 pp).

Chenjian's Electronic Packaging, 1 pg.

TAB Tape Carrier with Micro Plating Bumps for Burn-in Testing Socket, Akira Chinda, et al., Hitachi Cable Review No. 20, Aug. 2001, pp. 51-56.

* cited by examiner

METHOD FOR PREPARING INTEGRATED CIRCUIT MODULES FOR ATTACHMENT TO PRINTED CIRCUIT SUBSTRATES

BACKGROUND OF THE INVENTION

I. Field of the Invention

This invention relates generally to methods of manufacturing electronic circuit assemblies, and more particularly to a method of semiconductor packaging of single or multiple die using tape automated bonding tape for test and elevated temperature cycling (burn-in) of such semiconductor packages.

II. Discussion of the Prior Art

As integrated circuit (IC) chips are made smaller and of increased complexity and as clock speeds become higher and higher, methods had to be developed to provide a suitable interconnection between the IC chips and printed circuit substrates on which such IC chips are mounted. To address the complexity and size constraints imposed, electronic packaging engineers earlier devised a process called tape automated bonding, often referred to by the acronym TAB. Tape Automated Bonding (TAB) is an inner connect technology between integrated circuits and associated substrates wherein a prefabricated carrier with copper leads adapted to the IC pads instead of individual wires. This prefabricated carrier or tape consists of a perforated polyimide film, like camera film, and of the same dimensions, which has a transport perforation and stamped openings for the IC and the connection leads. A copper foil is glued to the film and the copper is etched using photolithography. TAB is an approach to reduce the pitch and to speed up interconnection of IC chips to a lead frame, especially for high-volume production applications. There are several types of copper/polyimide composite film materials that have been found quite suitable. The polyimide sheet material is laminated with the copper foil using a thermosetting adhesive. The copper is appropriately masked and etched using well-known techniques to define inner and outer pad areas connected by fine, closely spaced conductive traces. Vias through the thickness dimension of the tape are formed and the vias are appropriately metallized, such as by electroless copper plating or by a direct metallization process (DMP) which are the thru-hole copper plating processes that involve conductive thin film deposition on the organic polymer surface of the thru-hole wall and copper electroplating on it. The conductive traces on an undersurface of the TAB tape individually lead to a plurality of solder ball mounting pads commonly referred to as a ball grid array (BGA) that facilitate attachment of integrated circuit chips mounted on the TAB tape to a printed circuit substrate.

In accordance with the prior art and as reflected by the flow chart of FIG. 1, wire bonding techniques are used to connect a fine wire between an on-chip I/O pad and a pad on the TAB tape. Once all of the wire bonds are established, the semiconductor die or dies are overmolded with a plastic encapsulant, after which solder balls are attached to the pads in the BGA located on the undersurface of the TAB tape beneath the die.

Following the teachings of the prior art, the TAB tape is then severed about the perimeter of the integrated circuit to yield discrete chips. The discrete chips are then placed in a custom made ball grid socket so that testing and burn-in can be performed on the chip before it is mounted in the end device using a reflow solder technique to join the solder balls of the BGA to the printed circuit board of the end device.

BGA sockets used for test and burn-in are dependent on ball pitch, ball size and the package outline. Any variation from the standard results in an expensive, custom test socket. Burn-in of BGAs often results in deformation of the solder balls. In that BGA test sockets require a specific ball size, any change in ball size results in the need for retooling of the BGA sockets. This necessarily increases the manufacturing cost of an integrated circuit assembly.

In accordance with the present invention semiconductor I/O are routed on TAB tape first to BGA pads internal to the die outline and secondly to test pads located external to the semiconductor package outline. In this fashion, the test pads can be used during test and burn-in, making it unnecessary to have expensive BGA sockets in order to do the test and burn-in. The method of the present invention also eliminates the need to contact the solder balls on the BGA during testing and burn-in so that they remain properly spaced and shaped for later reflow solder attachment to mating pads on a printed circuit assembly.

SUMMARY OF THE INVENTION

The present invention comprises a method of preparing an integrated circuit module for attachment to a printed circuit substrate and involves the steps of providing a TAB tape frame having a predetermined conductive test pad footprint formed about a perimeter of the TAB tape frame and a bond pad footprint generally centrally disposed relative to the test pad footprint and that has conductive leads connecting the bond pads individually to the test pads as well as to BGA pads that are centrally disposed relative to the bond pad footprint. One or more semiconductor dies comprising integrated circuits are affixed to the TAB tape frame. Input/output points of the integrated circuits are wire-bonded to the selected ones of the bond pads in the bond pad footprint. Following that, the semiconductor die or dies and the bond pad footprint are overmolded with plastic to form the encapsulated integrated circuit module. Before cutting the integrated circuit module free of the TAB tape, testing and burn-in are performed on the integrated circuit by connecting test probes of an automated circuit tester to the conductive test pads in the test pad footprint.

As a further step in the method, solder balls may be applied to the ball grid array pads prior to the testing and burn-in step. Only after such test and burn-in operations are completed is the tab tape severed about the over-molded semiconductor die to extract the circuit module which then may be affixed to a printed circuit substrate by reflow soldering the solder balls on the ball grid array to conductive pads on the printed circuit board.

DESCRIPTION OF THE DRAWINGS

The foregoing features, objects and advantages of the present invention will become apparent to those skilled in the art from the following detailed description of a preferred embodiment, especially when considered in conjunction with the accompanying drawings in which:

FIG. 3D illustrates the IC, still mounted on the TAB tape at the time of test and burn-in;

DESCRIPTION OF THE PREFERRED EMBODIMENT

Figure 1:
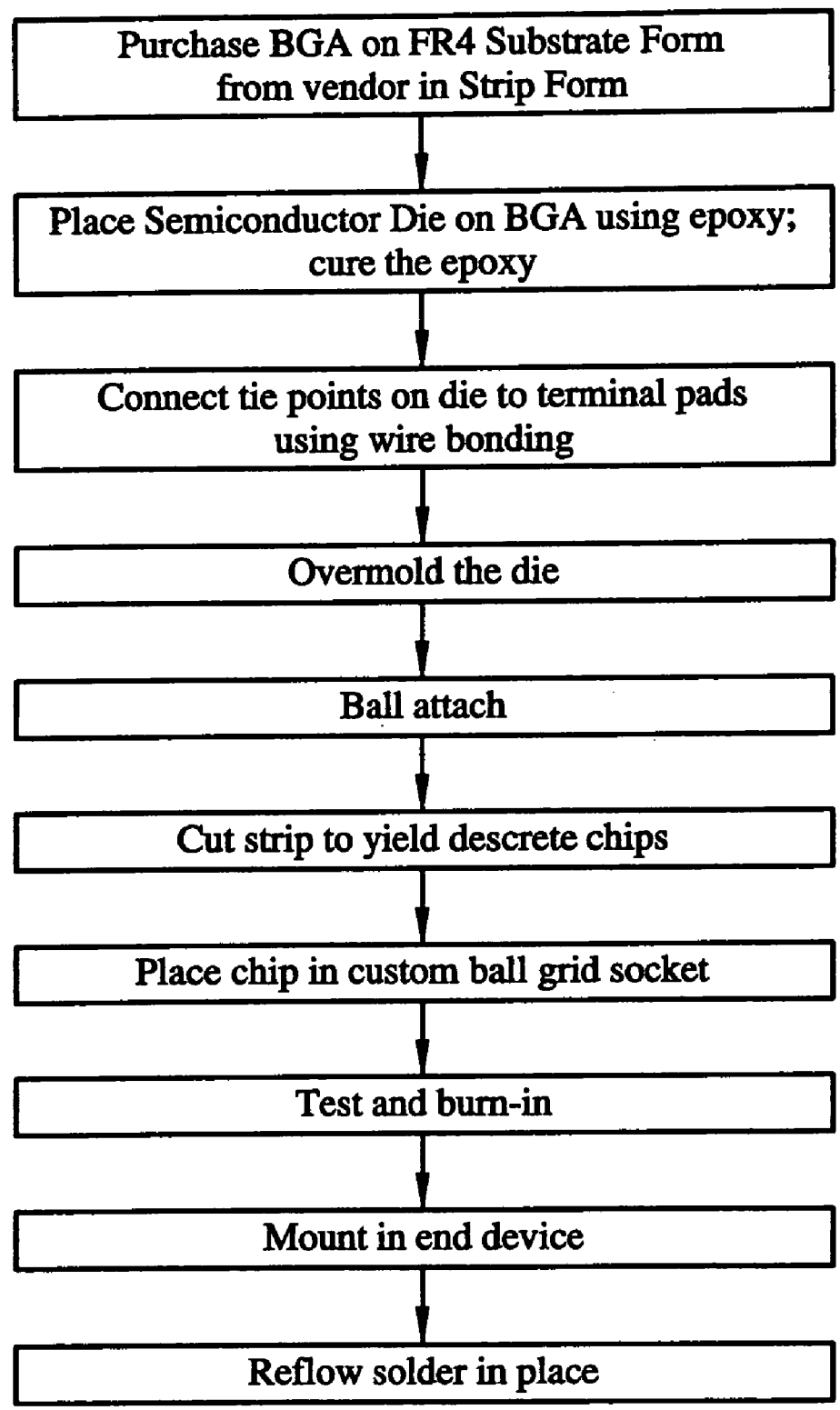
FIG. 1 is a process flow chart illustrating the prior art processing method for preparing an integrated circuit module for attachment to a printed circuit substrate.
Figure 2:
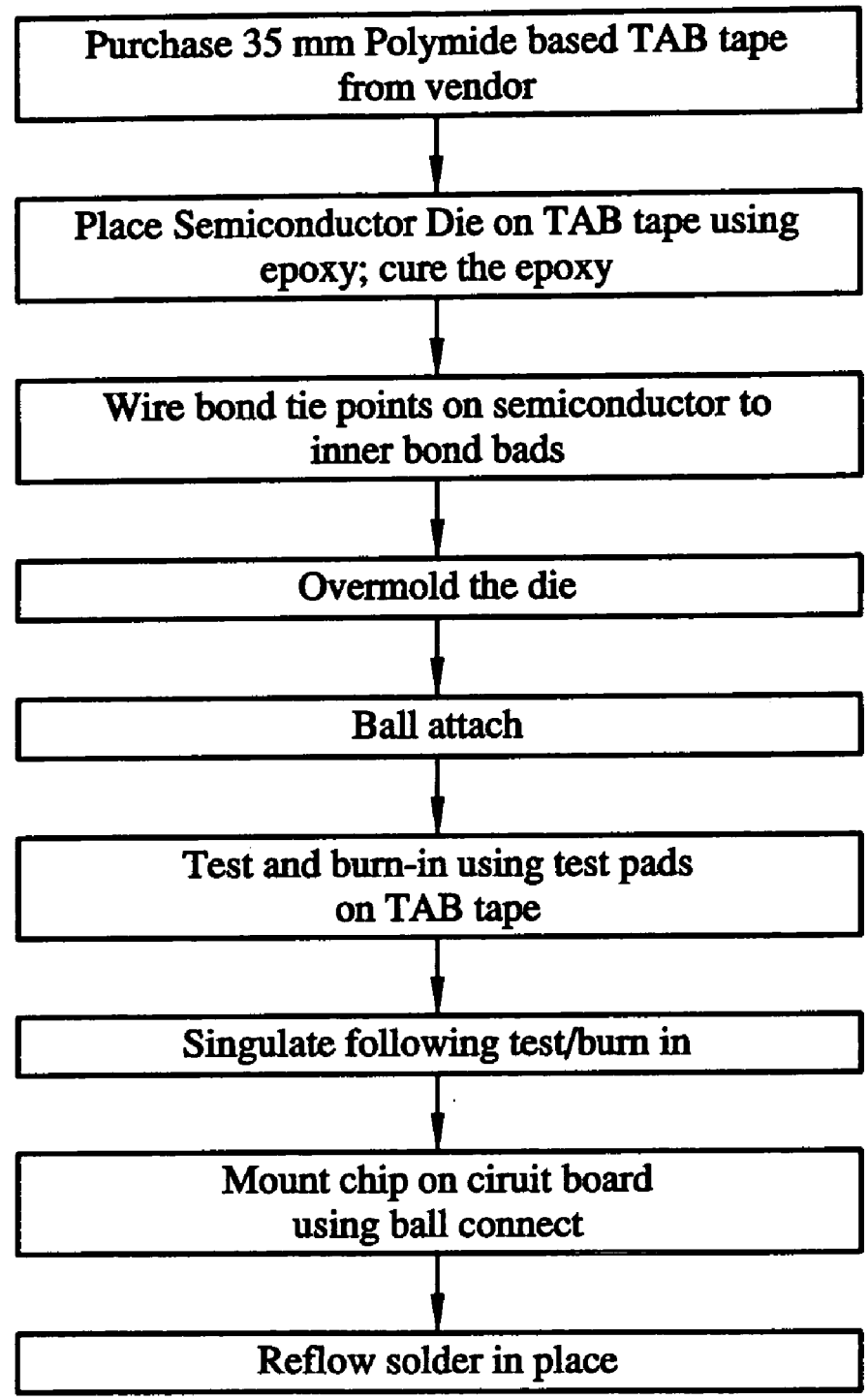
FIG. 2 is a process flow chart of the improved method in accordance with the present invention.
Figure 3A:
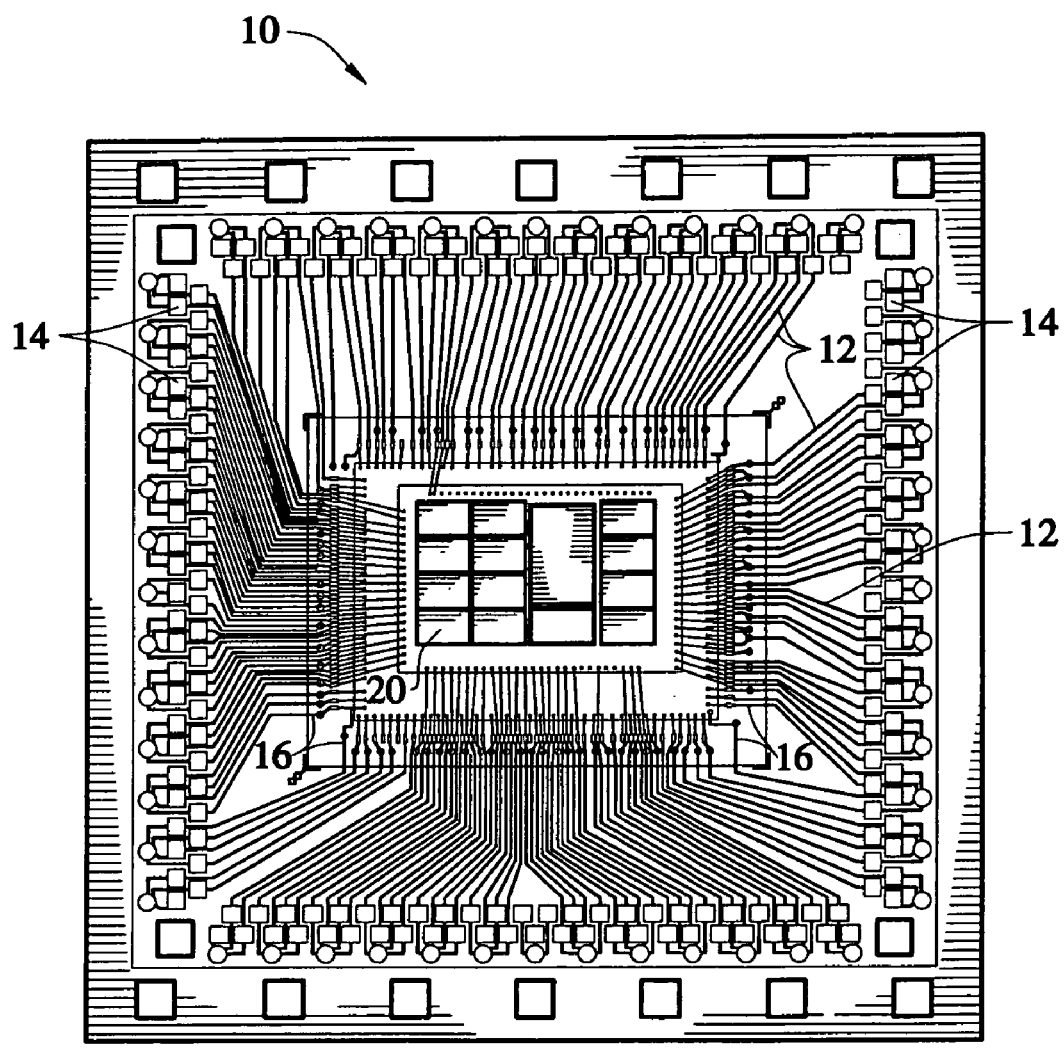
FIG. 3A shows an uncased semiconductor die bonded to a TAB tape with wire bonds connecting input/output points on the die with selected ones of the bond pads.

Referring to FIG. 2, the method of the present invention is expressed in the flow chart presented there. The first step in the process is to fabricate or procure from a vendor TAB tape, one frame of which is shown in the view of FIG. 3A. As explained earlier, it comprises a flexible polyimide substrate 10 having conductive traces 12 leading from a plurality of discrete test pads arranged in a pattern 14 in accordance with the standard EIAJ ED-7134A entitled "General Rules for the Preparation of Outline Drawings of Integrated Circuit Quad Tape Carrier Packages" proximate the perimeter of the frame to a plurality of bond pads as at 16 that also lie in a generally rectangular footprint that is centrally disposed relative to the test pad footprint 14.

Figure 3B:
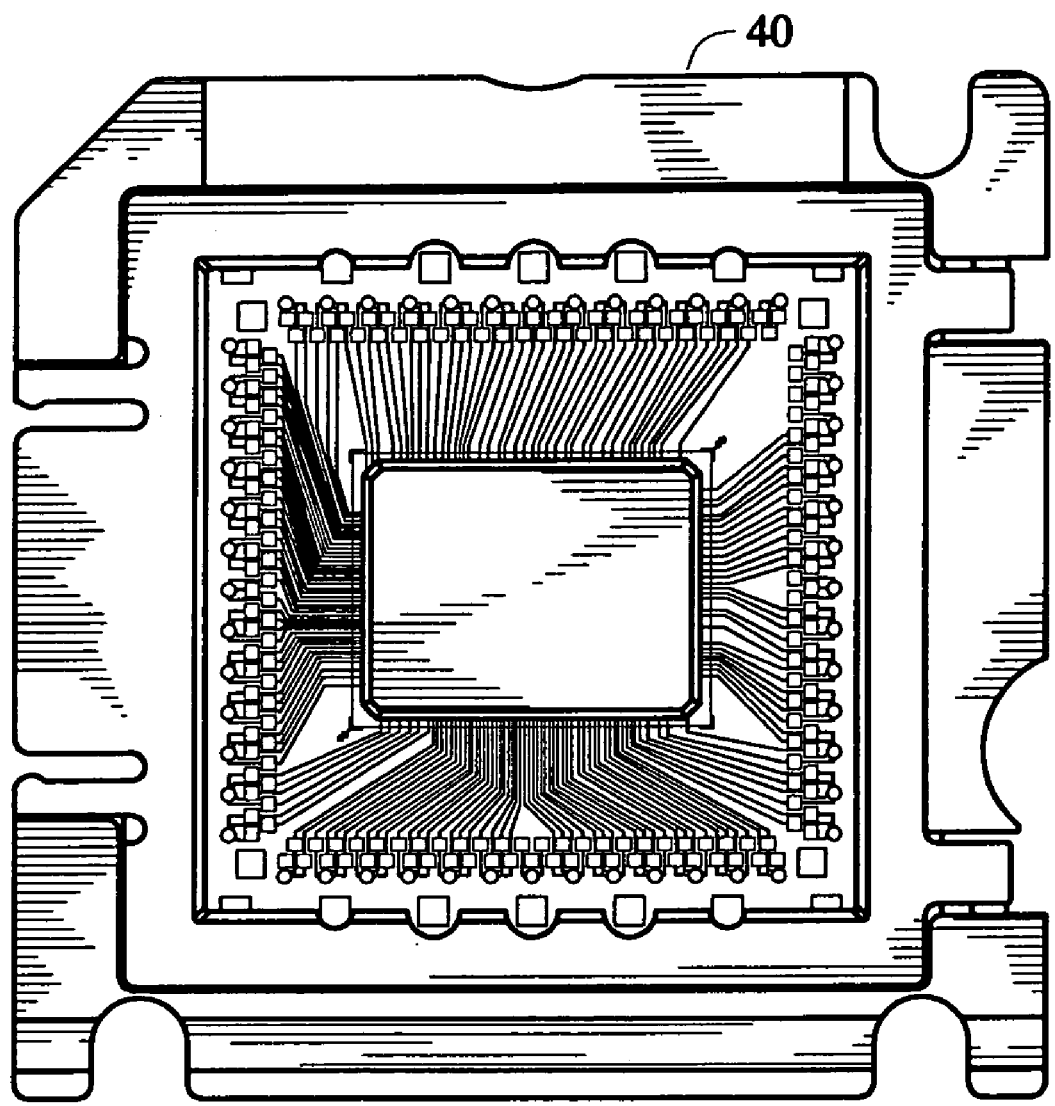
FIG. 3B shows the device of FIG. 3A following the overmolding of the die and bond pads with plastic.
Figure 3C:
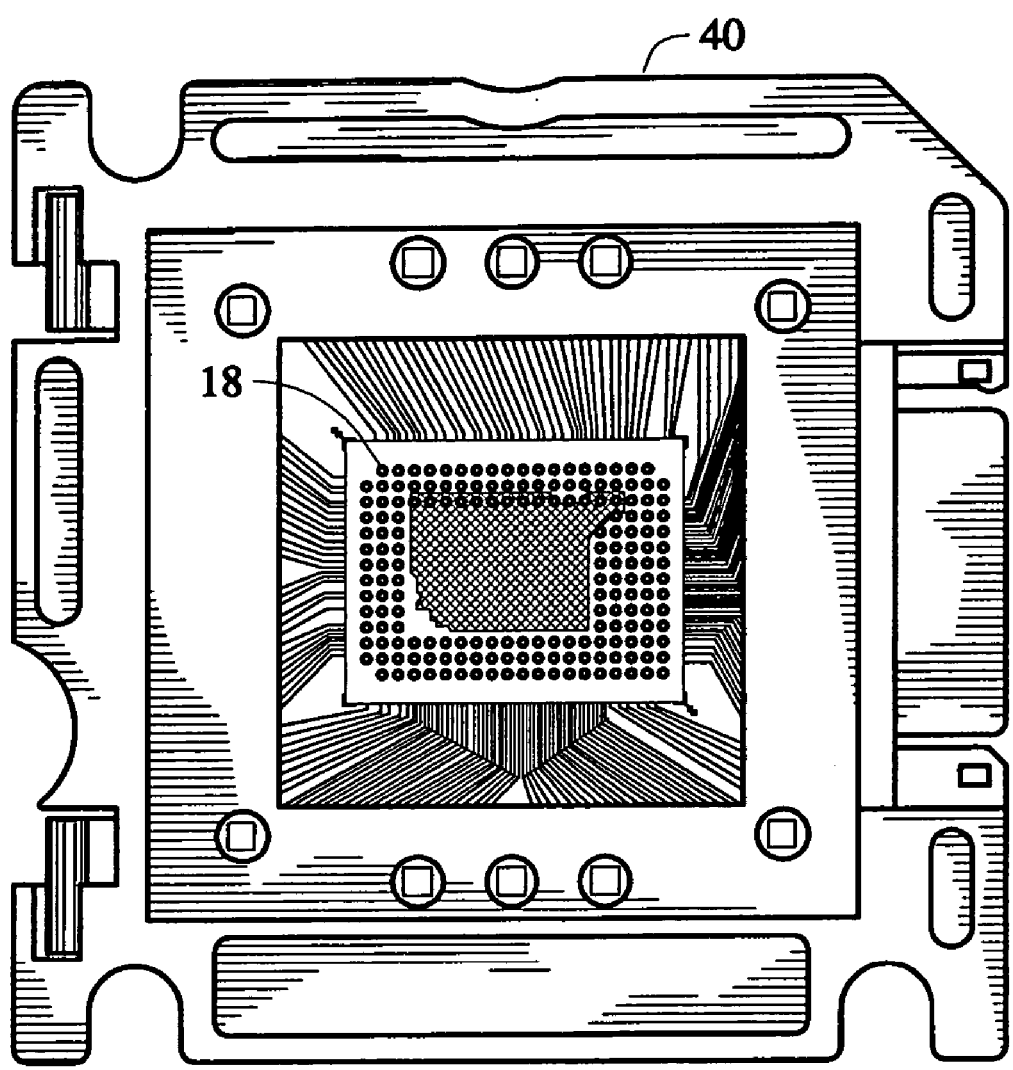
FIG. 3C is a view of the underside of the assembly of FIG. 3B showing solder balls attached to the BGA.
Figure 3D:
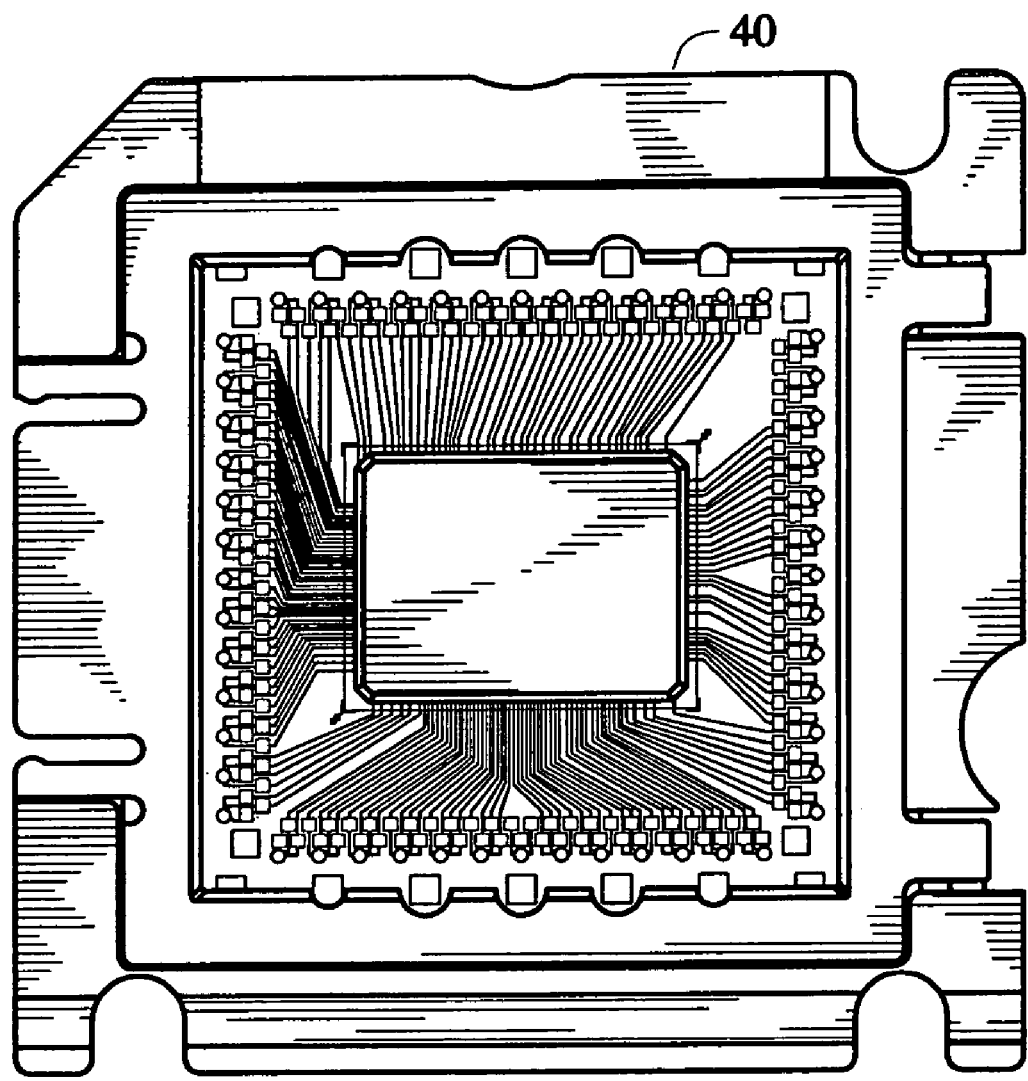

Referring momentarily to FIG. 3C, which shows the obverse side of the TAB tape frame, the conductive lines 12 not only connect the bond pads 16 individually to the test pads in footprint 14, but they also connect to ball grid array pads 18 that are generally centrally disposed relative to the bond pad footprint.

Referring again to FIG. 3A, and to the flow chart of FIG. 2, the next step in the process is to place a semiconductor die 20 on the tab tape within the confines of the bond pad footprint and to affix it in place with a suitable bonding agent such as epoxy. While the view of FIG. 3A shows an arrangement where two semiconductor dies are stacked to form a multi-chip module (MCM), those skilled in the art will appreciate that only a single die can be used in practicing the method of the present invention.

Once the semiconductor dies are placed and attached and the epoxy is allowed to cure, the next step in the process is to wire bond tie points on the semiconductor die(s) to ones of the inner bond pads 16. Here, fine gold or aluminum wires are temperature and compression bonded to tie points on the semiconductor die(s) and to bond pads on the TAB tape substrate using well-known techniques.

Once the wire bonding step has been completed, the bare semiconductor die(s) is/are overmolded with a suitable plastic, such as an epoxy, where the overmolding not only encapsulates the semiconductor die(s), but also the wire bond footprint. An approach commonly used to effect encapsulation is to first create a dam around the semiconductor die to define an area. The encapsulant as well as the substrate may be preheated to desired temperatures and a quantity of the encapsulant is dispensed around the bonding areas. Subsequently, the encapsulant is applied to fill in the complete area. In a dam & fill encapsulation process, the substrate is preheated to a temperature of about 100° C. and a high viscosity encapsulant is dispensed to form a high dam around the chip to define the area to be covered. Next, a low viscosity encapsulant is dispensed into the dammed area such that a very flat encapsulation profile is achieved. However, because the dam and fill technique, at times, does not create a well-defined edge along which a cut can be made, I prefer to use a conventional injection overmolding technique to achieve encapsulation. The overmolded die and bonding pads are shown in the view of FIG. 3B.

As is reflected in the flowchart of FIG. 2, the next step in the process is to attach solder balls to the BGA. As has already been explained, traces from the bond pads connect to thru-hole vias that extend to the bottom of the substrate and conductively join to circular solder pads on the bottom surface. As shown in FIG. 3C, the bottom side solder pads are laid out in a square or rectangular grid format with a predetermined pitch. Solder balls of a predetermined size are then reflow soldered to the BGA pads. The view of FIG. 3C shows the solder balls already attached to underlying BGA pads printed on the undersurface of the TAB substrate.

At this point, rather than severing the die from the TAB tape, the assembly of FIG. 3C is subjected to test & burn-in procedures where the assembly is raised to a somewhat elevated temperature and the test pads 14 are probed with a "bed-of-nails"-type tester whereby signals and operating potentials are applied to the encased chip by way of the conductive traces 12 and the wire bond connections and, likewise, output signals are picked up by the test probes from the test pads 14. By utilizing the test pads 14 rather than a custom BGA socket to establish contact between the encased semiconductor die and the external test equipment, there is no risk of deformation of the solder balls even when high temperatures are applied during the burn-in process. This better ensures that the solder balls will not be distorted, permitting a more precise match when the integrated circuit chip is to be reflow soldered to a printed circuit board.

Following the test and burn-in procedure, the encapsulated integrated circuit chip is singulated, i.e., cut free of the TAB frame. A stamping technique is preferably used to achieve singulation. The finished MCM is shown in FIG. 3E.

Figure 3E:
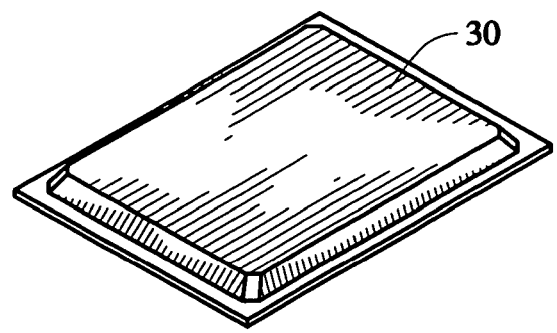
FIG. 3E shows the finished integrated circuit package after it has been stamped out from the TAB tape frame.
Figure 3F:
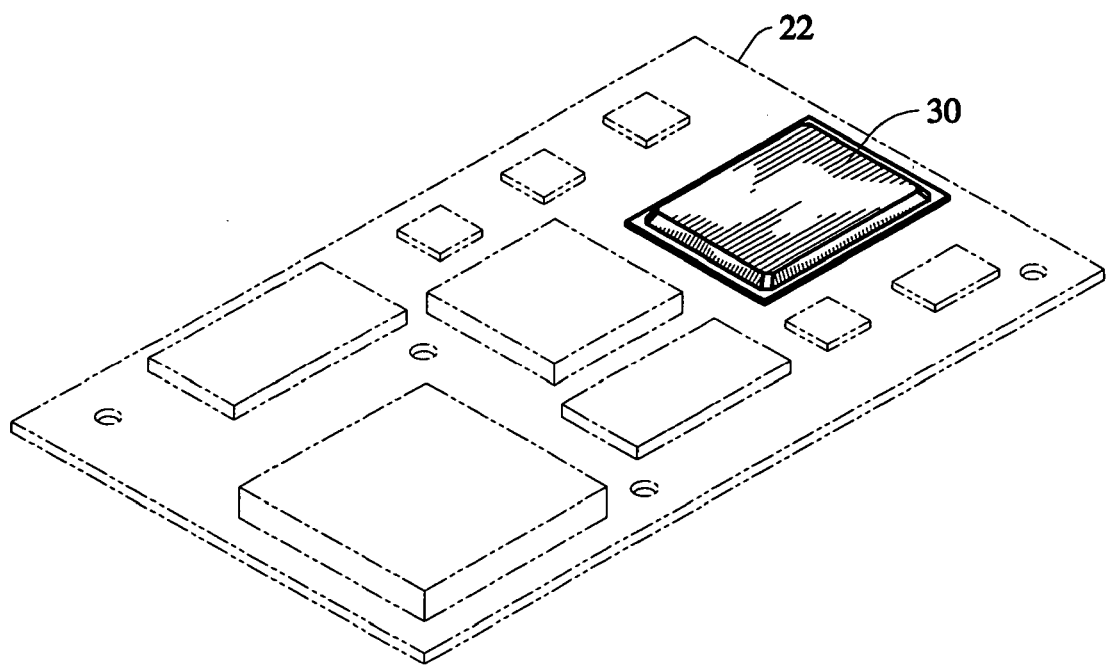
FIG. 3F shows the device of FIG. 3E mounted on a printed circuit board by reflow soldering of the solder balls.

FIG. 3F shows the chip of FIG. 3E mounted on a printed circuit board where the solder balls are reflow soldered so as to attach to printed circuit terminals on the substrate 22.

Whereas in the prior art method burn-in and test of BGAs involves contact the solder balls with a test socket that often causes the balls to deform during high temperature, the practice of the method of the present invention avoids changes in ball size and spacing, making it unnecessary to retool BGA sockets, as is often the case when the prior art method is utilized. Because the test probes are only made to engage the test pads of test pad footprint 14, a custom socket for mating with the BGA is unnecessary. Furthermore, the present invention allows for shaped packages that conform to odd assembly shapes in that ball location does not need to be on a standard grid nor is it necessary that the solder ball size be uniform as is the case when a BGA socket is used to interface the circuit tester with the IC.

This invention has been described herein in considerable detail in order to comply with the patent statutes and to provide those skilled in the art with the information needed to apply the novel principles and to construct and use such specialized components as are required. However, it is to be understood that the invention can be carried out by specifically different equipment and devices, and that various modifications, both as to the equipment and operating procedures, can be accomplished without departing from the scope of the invention itself.

The invention claimed is:

1. A method of preparing an integrated circuit module for attachment to a printed circuit substrate comprising the steps of:

(a) providing a tape automated bonding (TAB) tape frame having a predetermined conductive test pad footprint formed about a perimeter of the TAB tape frame and a bond pad footprint generally centrally disposed relative to the test pad footprint, with conductive leads connecting the bond pads individually to the test pads and to ball grid array pads generally centrally disposed relative to the bond pad footprint;

(b) permanently affixing a semiconductor die comprising an integrated circuit to the TAB tape frame, the integrated circuit having a plurality of input/output points within the bond pad footprint;

(c) wire bonding the input/output points of the integrated circuit to selected ones of the bond pads in the bond pad footprint of the TAB tape;

(d) overmolding the entire semiconductor die and the bond pad footprint with a plastic to form said integrated circuit module; and then (e) performing testing and burn-in on the integrated circuit by connecting test probes to the conductive test pads in the test pad footprint of the TAB tape.

2. The method of claim 1 and further including the steps of:

(a) applying solder balls to the ball grid array pads after the overmolding step and prior to the testing and burn-in step;

(b) cutting the TAB tape about the overmolded semiconductor die to extract the overmolded semiconductor die from a surrounding portion of the TAB tape following the testing and burn-in step; and (c) affixing the overmolded semiconductor die to a printed circuit substrate by means of the solder balls on the ball grid array of the TAB tape.

3. A method of preparing an integrated circuit module for attachment to a printed circuit substrate comprising the steps of:

(a) providing a tape automated bonding (TAB) tape frame having a predetermined conductive test pad footprint formed about a perimeter of the TAB tape frame and a bond pad footprint generally centrally disposed relative to the test pad footprint, with conductive leads connecting the bond pads individually to the test pads and to ball grid array pads generally centrally disposed relative to the bond pad footprint;

(b) permanently affixing at least two semiconductor dies, each comprising an integrated circuit to the TAB tape frame, the integrated circuits having a plurality of input/output points within the bond pad footprint of the TAB tape;

(c) wire bonding the input/output points of the integrated circuits to selected ones of the bond pads in the bond pad footprint of the TAB tape;

(d) overmolding the at least two semiconductor dies and the bond pad footprint entirely with a plastic to form said integrated circuit module; and then (e) performing testing and burn-in on the integrated circuits by connecting test probes to the conductive test pads in the test pad footprint of the TAB tape.

4. The method of claim 3 and further including the steps of:

(a) applying solder balls to the ball grid array pads of the TAB tape after the overmolding step and prior to the testing and burn-in step;

(b) cutting the TAB tape about the overmolded semiconductor dies to extract the overmolded semiconductor dies from a surrounding portion of the TAB tape following the testing and burn-in step; and (c) affixing the overmolded semiconductor dies to a printed circuit substrate by means of the solder balls on the ball grid array of the TAB tape.

* * * * *